United States Patent [19]

Pennings

[11] 4,124,132
[45] Nov. 7, 1978

[54] MAGAZINE APPARATUS FOR SEMICONDUCTOR PROCESSING DEVICE

[75] Inventor: Matheus D. Pennings, Los Altos Hills, Calif.

[73] Assignee: Sola Basic Industries, Inc., Milwaukee, Wis.

[21] Appl. No.: 798,114

[22] Filed: May 18, 1977

[51] Int. Cl.² .................................................... B65G 65/36
[52] U.S. Cl. .................................................... 214/301
[58] Field of Search .................. 221/81, 87, 88, 79, 221/273, 274, 275; 214/301, 310; 353/116

[56] References Cited

U.S. PATENT DOCUMENTS

| 3,557,976 | 1/1971 | Isobe | 214/301 X |
| 3,902,615 | 9/1975 | Levy et al. | 214/301 |

FOREIGN PATENT DOCUMENTS

| 261,044 | 10/1964 | Australia | 353/116 |
| 1,118,493 | 11/1961 | Fed. Rep. of Germany | 353/116 |

Primary Examiner—Stanley H. Tollberg
Attorney, Agent, or Firm—Blakely, Sokoloff, Taylor & Zafman

[57] ABSTRACT

A magazine and driving means particularly adaptable for handling semiconductor lead frames, or the like, in an automatic processing device such as a bonder is described. The magazines slidingly engage buttons on the front panel of the bonder or other device. In-line teeth defining a rack are formed on the exterior of each of the magazines. The magazines are driven directly by indexing pins which are connected to a geneva movement. Missing teeth at the ends of the racks allow the magazines to feed-through, thus providing automatic, uninterrupted operation from magazine-to-magazine.

12 Claims, 6 Drawing Figures

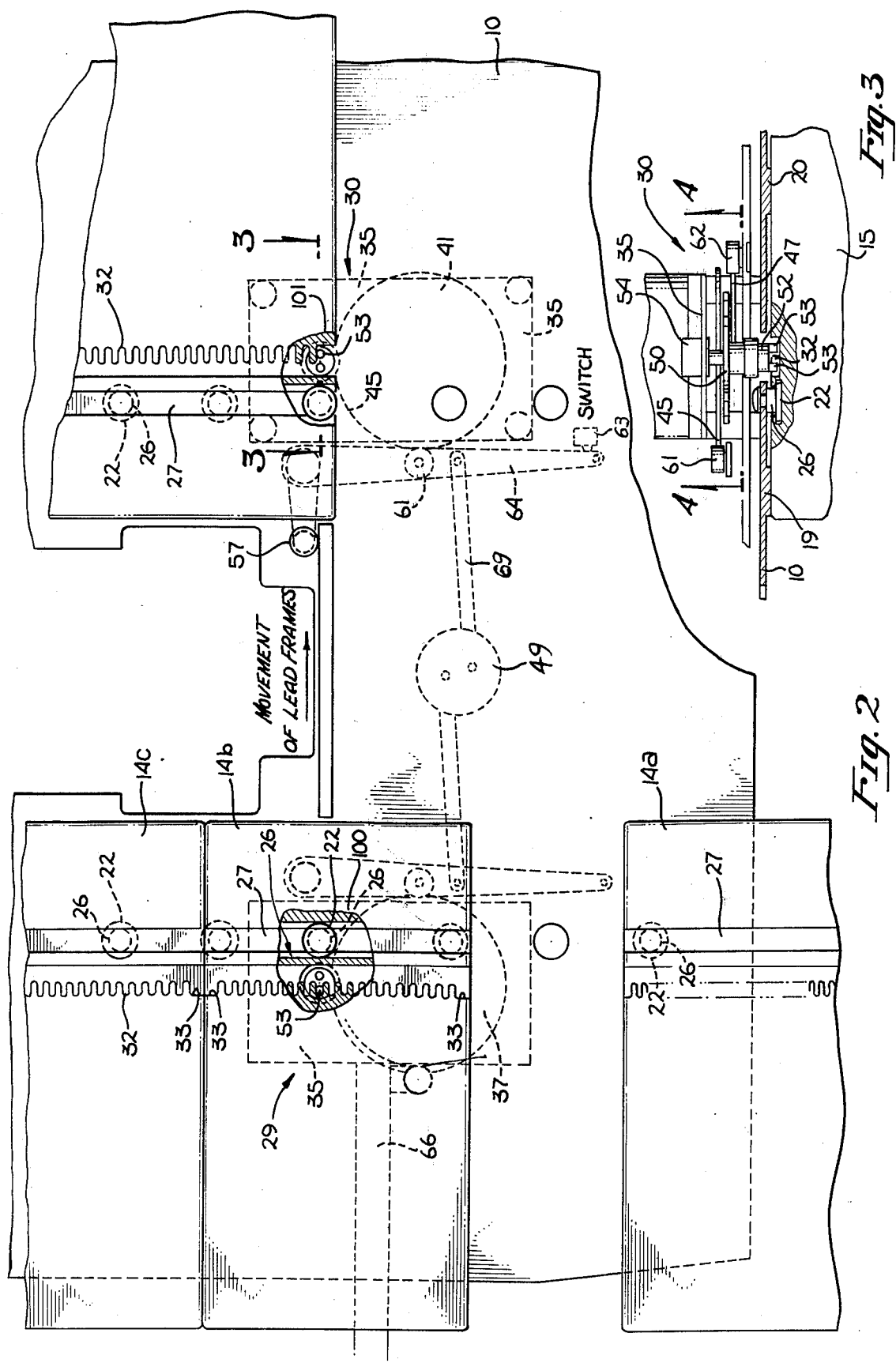

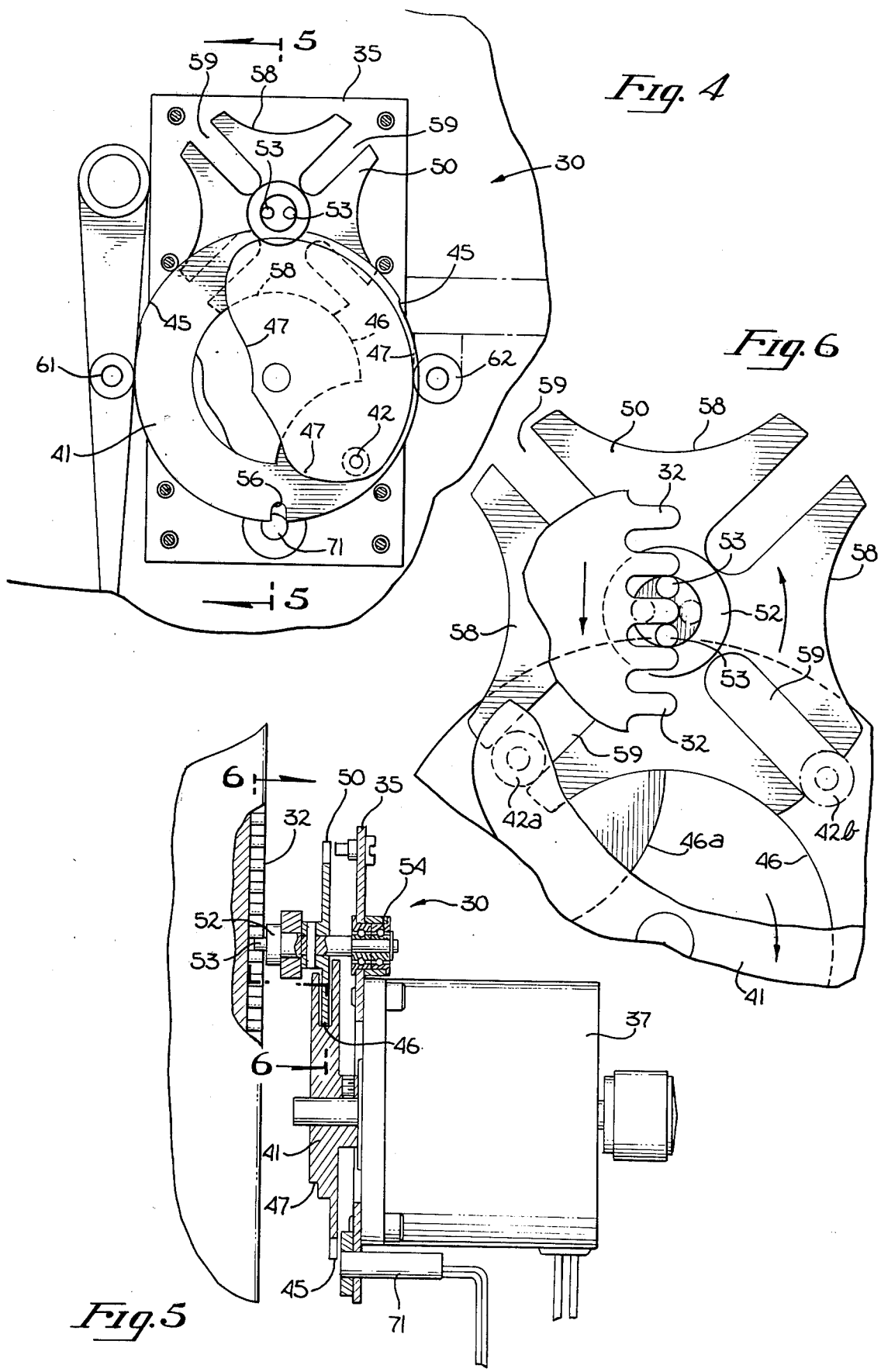

MAGAZINE APPARATUS FOR SEMICONDUCTOR PROCESSING DEVICE

BACKGROUND OF THE INVENTION

1. Field of the Invention

The invention relates to magazines and their driving means, particularly those employed in the semiconductor industry for handling lead frames.

2. Prior Art

In the semiconductor industry it is often necessary to handle large numbers of semiconductor dies for processing or testing, such as for bonding. These dies are generally mounted on lead frames, or may be held in a tray or on other mounting strips. A plurality of these strips are housed in a magazine and fed from the magazine for processing, testing, or the like. After each lead frame or other holding means is removed from the magazine, the magazine is typically indexed downwardly or upwardly to allow the next lead frame or other holder to be removed from the magazine.

Often the magazine is placed on an elevator and the elevator is indexed downwardly to allow each of the holders to be extracted. After all the holders have been removed from a magazine, the magazine is manually removed from the elevator and another magazine placed on the elevator while the elevator is raised to its starting position. A like apparatus is used for unloading the holders after processing.

As will be seen, with the presently disclosed apparatus the magazines are directly driven without the need for the more complex elevator employed in the prior art. Moreover, manual changing of the magazine is not required when a magazine is emptied or filled since the apparatus allows the magazines to be automatically fed-through.

SUMMARY OF THE INVENTION

An apparatus for handling holders such as lead frames, trays, mounting strips, or other holders used in automatic semiconductor bonders, probers, or like devices is described. Magazines are employed each of which includes an interior for receiving at least one holder. The exterior of each magazine includes in-line teeth and mounting means for mounting the magazine for movement on the bonder or other device. Indexing pins of a driving means directly engage the teeth of the magazine to selectively provide movement of the magazine relative to the device. The driving means includes a geneva movement which indexes the magazines. The teeth on the magazines are spaced apart from the opposite edges of the magazines such that when the indexing pins reaches the last tooth on one magazine, the pins next engages the first tooth on a second magazine. In this manner, the magazines are automatically fed-through and compensation is provided for the thickness of the top and bottom walls of the magazines.

BRIEF DESCRIPTION OF THE DRAWINGS

FIG. 2 is a elevation view of the bonder of FIG. 1 including the magazines and their driving means with a portion of the magazines cutaway at sections 100 and 101 to reveal underlying details.

FIG. 3 is a cross-sectional plan view of a portion of the load driving means generally taken through section line 3—3 of FIG. 2.

FIG. 4 is a cross-sectional elevation view of the driving means of FIG. 3 taken through section line 4—4 of FIG. 3.

FIG. 5 is a cross-sectional, side view of the driving means of FIGS. 3 and 4 taken through section line 5—5 of FIG. 4; and FIG. 6 is an exploded partial view of the driving means and magazine of FIG. 5 taken through the section line 6—6 of FIG. 5.

DETAILED DESCRIPTION OF THE INVENTION

Figure 1:
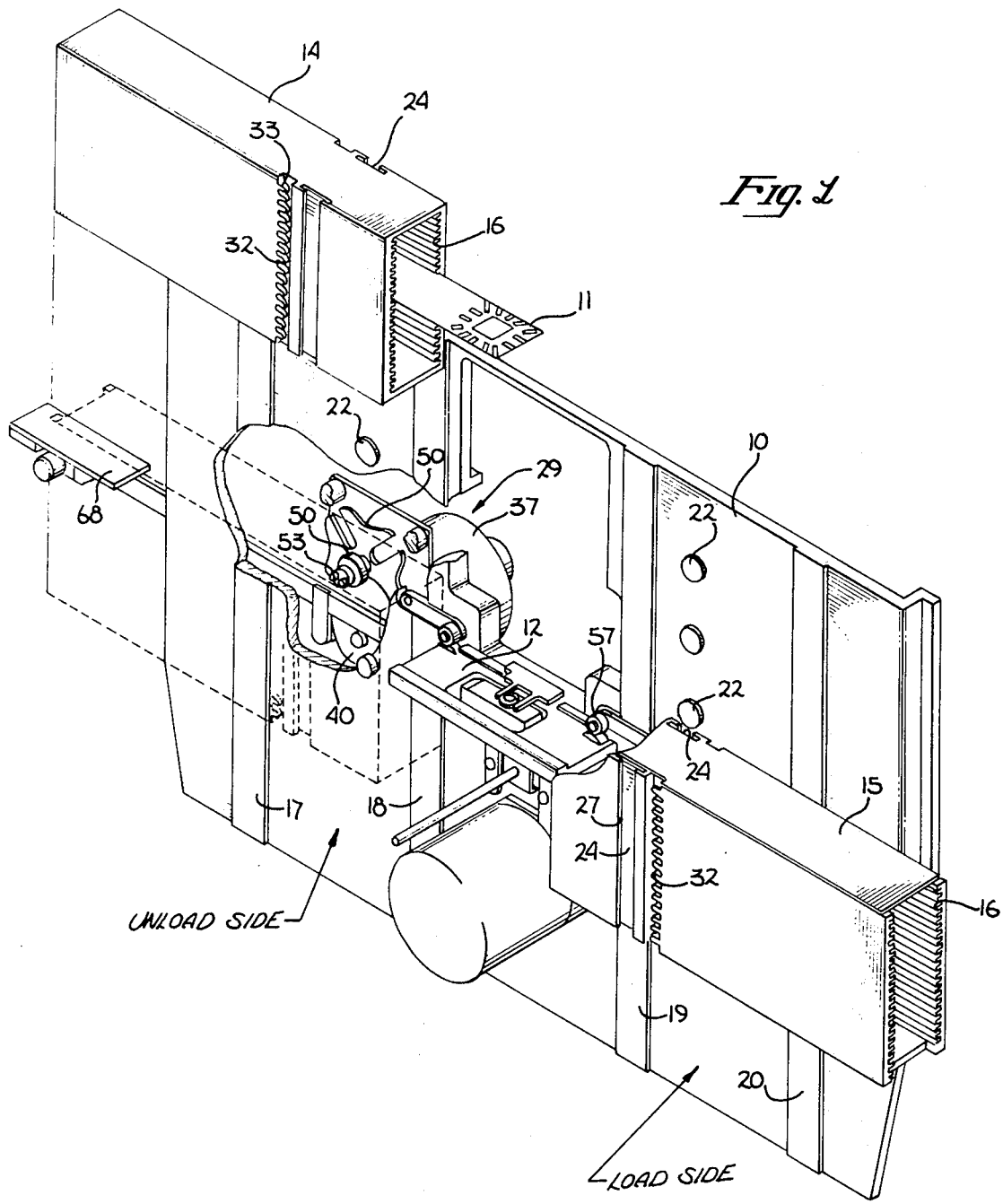
FIG. 1 is a general perspective view of the front panel of a semiconductor bonder illustrating an unload and load magazine with a portion of the front panel of the bonder cutaway to illustrate the driving means for the unload magazine.

A magazine and its driving means which is particularly suitable for use with a semiconductor processing device such as an automatic bonder, prober, or other processing or testing device is described. Typically, the semiconductor dies are disposed on a holder with a plurality of holders contained in a magazine. The holders are removed from the magazine in order that the dies may be processed or tested. Typically, these holders comprise lead frames or mounting strips, however, other types of holder, such as a tray may be employed. The described apparatus may also be employed to handle semiconductor wafers (in this case the width and depth of the magazine may be equal). Wafers may then be automatically fed into spinners, mask aliners, inspection stations or other processing stations.

In the following description, the magazine and its driving means are described in conjunction with an automatic bonder where the semiconductor dies are mounted on lead frames. During the processing, as will be seen, the lead frames are moved from an unload magazine to a load magazine across a bonding table. It will be obvious to one skilled in the art, however, that the described magazine and its driving means may be employed with holders other than lead frames and that the magazine and driving means may be used with devices other than automatic bonders.

Referring now to FIG. 1, a front panel 10 of an automatic bonder is illustrated. For a description of other portions of this automatic bonder, see copending application Ser. No. 797,622 filed May 18, 1977 now U.S. Pat. No. 4,109,846 and assigned to the assignee of this application. During operation of this bonder, lead frames such as the lead frame 11 shown projecting from a magazine 14, are incremented from a load magazine adjacent to the bonding table 12, across the bonding table 12 (the bonding capillary is not illustrated) and into a load magazine 15.

The magazines are driven (indexed) directly by a driving means. The unload driving means 29 is partially illustrated in FIG. 1 and the load driving means 30 is illustrated in greater detail in FIGS. 2, 3, 4, 5 and 6. Since these driving means are substantially identical, only the load driving means is described in detail. In general each of the driving means comprises a geneva movement which includes geneva gear 50 of FIG. 1 and which is driven by a stepping motor 37 through a cam wheel 40.

The unload and load magazines are identical, and as will be seen, the magazines may be driven from either side thus allowing great versatility in moving the magazines from device-to-device for different functions. In general, the magazines such as magazines 14 and 15 of FIG. 1, are generally rectilinear metal housings which include internally disposed parallel ribs 16 for receiving a plurality of lead frames 11.

The magazines are mounted for vertical movement on the panel 10 by channels 24, which channels engage the vertically aligned buttons 22 of the panel 10. The channels 24 are elongated channels which extend from opposite edges of the magazines and which are defined by the exterior surface of the magazines. A pair of channels 24 are disposed in back-to-back position on opposite sides of the magazines as is best illustrated by magazine 14. The channel openings are restricted to opening 27, best seen in FIG. 2.

The spring loaded buttons 22 extend from the front surface of the panel 10 on button shafts 26 (FIG. 3). These buttons engage the channels of the magazines such that the buttons 22 engage the channels 24 with the shafts 26 engaging the channel openings 27. The relative dimensions of the buttons 22, shafts 26, channels 24, and channel openings 27 are readily seen in FIG. 2. The flanged bearings employed for these buttons present little friction to the magazines, however, they do include substantial play. A strip having a T cross-section may be used instead of these buttons. This would provide better alignment but would present more friction.

As is best seen in FIG. 1, the plurality of buttons 22 on both the unload and load side allow the magazines to freely move in the vertical direction. The magazines are manually inserted at the top button such that this button enters the end of a channel 24. The front panel 10 includes rails 17 and 18 on the unload side and rails 19 and 20 on the load side. These rails contact the magazines and as is best seen in FIG. 3, provide a surface upon which the magazines may slide in the vertical direction.

Referring again to FIGS. 1 and 2, the exterior of the magazines define a plurality of in-line teeth 32 which form racks on the exterior of the magazines. These racks are parallel to the channels 24 and transverse to the ribs 16. The racks are formed on both sides of the magazines 14 with teeth facing inwardly towards the channels. The pitch of these teeth is twice the center line to center line spacing of the ribs 16 for the described embodiment.

The teeth of the rack do not extend completely to the upper and lower edges of the magazines but rather are spaced apart from the edges as may be seen by spaces 33 of FIG. 2. These missing teeth (spaces 33) compensate for the thickness of the upper and lower walls of the magazines. As will be described in greater detail, when the indexing pins of the driving means reach these spaces 33, the magazines automatically feed-through so that after the last lead frame in one magazine is removed, the lowest lead frame in the next magazine is removed, the lowest lead frame in the next magazine is brought in-line with the bonding table 12.

Referring to FIGS. 2, 3, 4 and 5, both the unload and load driving means are each mounted on a plate 35 which is secured to the front panel 10. As is best seen in FIG. 5, the driving means is driven by a stepping motor 37. This motor is concentrically mounted with a cam wheel 41 which wheel serves several purposes. In general, the cam wheel 41 drives the geneva gear 50, its outermost camming surface 45 engages the cam follower 61 (FIGS. 3 and 4) and an inner camming surface 47 engages a cam follower 62.

The geneva gear 50 is mounted for rotation by bearing 54 to plate 35 above stepping motor 37 as is best seen in FIG. 5. This gear drives an indexing wheel 52, which wheel includes a pair of indexing pins 53. The pins as is best illustrated in FIGS. 5 and 6, cooperatively engage the magazine racks. The geneva gear 50 as may be seen in FIGS. 4 and 6, includes four driving notches 59 separated by locking sectors 58. The circular locking sectors 58 cooperatively engage the camming surface 46, which surface is part of the cam wheel 41. When the surface 46 is in engagement with one of the four sectors 58, the geneva gear 50 is locked. However, as the cam wheel 41 rotates such that section 46a of camming surface 46 (see FIGS. 4 and 6) is adjacent to a sector 58, the geneva gear is unlocked. The geneva gear is driven by a pin 42 which pin is offset from the center of wheel 41. As is best illustrated in FIG. 6, as the unlocking section 46a of the camming surface 46 unlocks the geneva gear 50, the pin shown as pin 42a engages one of the four notches 59 thereby rotating the geneva gear 90° to position 42b. Thus, for each complete rotation of the cam wheel 41, the geneva gear 50 and the indexing pins 53 are rotated 90°.

The camming surface 47 illustrated in FIGS. 3, 4, and 5 operates against the cam follower 62 and is used to operate jaws which pull a lead frame from the table into the load magazine. A corresponding camming surface on the unload drive operates lever 66 of FIG. 2 to activate the pusher 68 (FIG. 1) thereby urging a lead frame from the unload magazine.

In another embodiment a blast of air is employed to urge the lead frame from the table 12 into the load magazine in lieu of mechanical jaws.

The lever arm 64 is pivotally mounted with the arm of roller 57 (FIG. 2). The cam follower 61 is mounted on arm 64 for engaging the camming surface 45 of wheel 41. A linkage 69 interconnects the arm 64 with a rotary solenoid 49. A switch 63 is mounted for actuation by arm 64. A similar linkage and cam follower engages the outermost camming surface associated with the unload magazine drive.

When a lead frame is moved from under the roller 57, the roller 57 drops and engages the table 12. This activates switch 63. (Note with the wheel 41 in its stationary position, the roller 61 does not engage the camming surface 45.) Switch 63 starts the rotation of the stepping motor 37 to index the load magazine and to lift the roller 57. The next lead frame may then be brought under roller 57. It is also necessary to lift the roller 57 when the lead frame is being accurately located on the table 12. This is done by activating the rotary solenoid 49. This solenoid pulls the linkage 69 in the direction necessary to lift roller 57. The rotary solenoid 49 also lifts a corresponding roller on the feeding side of the bonding table when the lead frame is being precisely located.

As may be seen in FIG. 1, a roller corresponding to roller 57 is included on the feed-side of the table 12. The outermost camming surface corresponding to camming surface 45 on the unload side lifts this roller immediately after the unload magazine has been indexed downwardly so that the next lead frame may be pushed between a feed roller and this roller by the pusher 68. At the end of the inward stroke of pusher 68, this outermost camming surface lowers the roller into engagement with the lead frame.

In the presently preferred embodiment, as soon as a lead frame has been completely removed from the unload magazine this magazine is indexed downwardly and the next lead frame is urged onto the bonding table 12. Similarly, when a lead frame disengages roller 57 and is urged into the load magazine this magazine increments downwardly.

In operation, a plurality of lead frames are placed within the magazine 14 of FIG. 1. A plurality of such magazines may be brought into cooperative engagement with the buttons 22. The first such magazine is manually lowered until the first tooth of the rack engages the indexing pins 53. The engagement between the teeth 32 of the rack and the indexing pins 53 is best illustrated in the cutaway sections 100 and 101 of FIG. 2, and in FIGS. 5 and 6. Other magazines are placed on the load side of the bonder to accept the lead frames as they pass over the bonding table 12.

When the apparatus is first activated the stepping motor 37 of FIG. 1 drives the cam wheel 40 through one complete revolution. Note that the starting point and resting point for the cam wheels 40 and 41 is detected by a detector such as detector 71 of FIG. 4 which senses the notch 66 of the wheel 41. For the unload magazine, a revolution of the wheel 40 first causes the geneva gear 50 to bring the first lead frame into general horizontal alignment with the table 12. Then while pressure has been removed from the rollers such as roller 57, the pusher 68 urges the first lead frame onto the table.

Simultaneously with this operation, on the load side, a complete revolution of the wheel 41 first causes the lead frame on the table (if one is on the table) to be drawn into the magazine 15 and then rotates the indexing wheel 90° to bring the next pair of ribs 16 into the correct horizontal position to receive another lead frame from the bonding table 12.

The movement of the lead frames during bonding is controlled by means not illustrated.

An important feature of the presently invented apparatus is that the magazines are automatically fed-through. That is, for the unload magazine, once it is emptied, the next full magazine is automatically brought into the correct position for unloading. On the load side, once a magazine is completely loaded, an empty magazine is then brought into the correct position for loading. This occurs, as previously explained, because of the spaces 33 (missing teeth). These missing teeth allow one magazine to drop away while bringing the next magazine into proper position. This is a substantial improvement over the prior art where magazines must be manually changed when emptied for the unload operation and when filled for the load operation. When the indexing pins are in engagement with the last tooth of the magazine 14b, (see FIG. 2) the uppermost lead frame in this magazine is removed. When the indexing wheel next rotates 90° it engages the first tooth of the magazine 14c. At this point, the magazine 14b drops downwardly as shown by magazine 14a and falls free of the bonder. Similarly on the load side the filled magazines drop from the bonder.

Thus, a magazine and its driving means, particularly suited for handling holders of semiconductor dies such as lead frame has been described. The magazines are driven directly by the driving means without a moveable platform or elevator often employed in the prior art. Magazines are automatically fed-through when filled or emptied, thereby eliminating the manual replacement required for each magazine with prior art devices.

I claim:

1. In an automatic semiconductor bonder, prober or like device which operates with lead frames, trays, mounting strips or other holders or with semiconductor wafers; an apparatus for handling such holders or wafers comprising:

a magazine having an interior for receiving at least one of said holders or wafers, the exterior of said magazine including teeth and mounting means for mounting said magazine for movement on said device; and, driving means coupled to said device for engaging said teeth to selectively provide said movement of said magazine relative to said device;

said teeth defining a rack on said magazine in-line with the direction of said movement;

said mounting means comprising an elongated channel on said exterior of said magazine generally parallel to said rack, said channel having an elongated outer opening more narrow than the inner width of said channel for engaging a T-shaped mount extending from said device;

whereby said holders or wafers may be removed from a plurality of said magazines for bonding, probing or other operations.

2. The apparatus defined by claim 1 wherein said teeth of said rack are spaced apart from opposite edges of said magazine such that when said driving means reaches the end of one of said racks on a first of said magazines said driving means next engages the end of another of said racks on a second of said magazines, whereby magazines are automatically fed-through.

3. The apparatus defined by claim 2 wherein said driving means comprises a geneva movement.

4. The apparatus defined by claim 3 wherein the interior of said magazine includes a plurality of ribs for receiving said holders or wafers, said ribs generally transverse to the direction of movement of said magazine.

5. The apparatus defined by claim 4 wherein said magazine is generally rectilinear in shape and said magazine includes one of said racks and one of said channels on each of opposite sides of said magazine.

6. In an automatic semiconductor bonder, prober or like device which operates with lead frames, trays, mounting strips or other holders or semiconductor wafers; an apparatus for handling such holders comprising:

a generally rectilinear magazine having an interior for receiving at least one of said holders or wafers, the exterior of said magazine including a rack defined by a plurality of in-line teeth and mounting means for mounting said magazine for movement on said device;

said mounting means includes a channel disposed generally parallel to said rack on the exterior of said magazine, said channel including an elongated outer opening more narrow than the inner width of said channel for engaging T-shaped mounts on said device; and, driving means coupled to said device for selectively moving said magazine in the direction of said in-line teeth, said driving means including a geneva movement having indexing pins which cooperatively engage said teeth;

whereby said holders or wafers may be removed from a plurality of said magazines for bonding, probing or other operations.

7. The apparatus defined by claim 6 wherein said teeth of said rack begin at points spaced apart from the edges of said magazine such that when said pins reach the end of one of said racks on a first of said magazines said pins next engage the end of another of said racks on a second of said magazines, whereby magazines are automatically fed-through.

8. The apparatus defined by claim 7 wherein said interior of said magazine includes a plurality of parallel ribs for engaging said holders or wafers, said ribs generally transverse to said rack.

9. The apparatus defined by claim 8 wherein one of said racks and one of said channels are disposed on each of opposite sides of said magazine.

10. The apparatus defined by claim 9 including pushing means for urging holders from said magazine, said pushing means driven by a cam.

11. The apparatus defined by claim 10 wherein said cam is mounted for rotation with an intermittent gear means which indexes said geneva movement.

12. In an automatic semiconductor bonder, prober or like device which operates with lead frames, trays, mounting strips, or other holders or with semiconductor wafers; an apparatus for handling such holders or wafers comprising:

a plurality of magazines each having an interior for receiving at least one of said holders or wafers, the exterior of said magazines including teeth and mounting means for mounting said magazines for movement on said device, said teeth forming a rack on each of said magazines in-line with the direction of said movement;

said teeth having a first pitch in the central region of each of said racks and a second pitch, greater than said first pitch, at the ends of each of said racks, said second pitch to compensate for the thickness of the end walls of said magazines;

driving means coupled to said device for engaging said teeth to selectively provide said movement of said magazines relative to said device;

whereby said magazines are automatically fed through such that said holders or wafers may be removed from said plurality of said magazines for bonding, probing or other operations.

* * * * *